United States Patent
Shiraishi et al.

(10) Patent No.: US 11,310,899 B2
(45) Date of Patent: Apr. 19, 2022

(54) TARGET SUPPLY DEVICE, TARGET SUPPLY METHOD, AND ELECTRONIC DEVICE MANUFACTURING METHOD

(71) Applicant: Gigaphoton Inc., Tochigi (JP)

(72) Inventors: Yutaka Shiraishi, Oyama (JP); Tsukasa Hori, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/308,182

(22) Filed: May 5, 2021

(65) Prior Publication Data

US 2021/0410261 A1    Dec. 30, 2021

(30) Foreign Application Priority Data

Jun. 24, 2020  (JP) .............................. JP2020-108505

(51) Int. Cl.
*H05G 2/00*    (2006.01)
*G03F 7/20*    (2006.01)

(52) U.S. Cl.
CPC ......... *H05G 2/006* (2013.01); *G03F 7/70033* (2013.01); *H05G 2/008* (2013.01)

(58) Field of Classification Search
None
See application file for complete search history.

(56) References Cited

U.S. PATENT DOCUMENTS

| | | | | |
|---|---|---|---|---|
| 2008/0067456 A1* | 3/2008 | Kloepfel | ................ | H05G 2/003 250/504 R |
| 2012/0292527 A1* | 11/2012 | Fomenkov | ................ | H05H 1/46 250/432 R |
| 2017/0350745 A1 | 12/2017 | Nagano et al. | | |

FOREIGN PATENT DOCUMENTS

| | | |
|---|---|---|
| JP | H06-275535 A | 9/1994 |
| JP | H09-217849 A | 8/1997 |
| JP | 2001-315962 A | 11/2001 |
| JP | 2015-053292 A | 3/2015 |

OTHER PUBLICATIONS

Japanese Ball Valve General Catalog, Oct. 2016 p. 1-30. World-class quality metal touch ball valves capable of working in harsh environments. Nippon Ball Valve Co,. Ltd.

\* cited by examiner

*Primary Examiner* — Michelle M Iacoletti

(74) *Attorney, Agent, or Firm* — Studebaker & Brackett PC

(57) ABSTRACT

A target supply device may include a first container configured to contain a solid target substance; a second container including a first connection port connected to the first container, a second connection port connected to a first pressurized gas supply line, and a third connection port connected to a target substance lead-out path; a moving body including a first recessed portion configured to contain the solid target substance supplied from the first container and move the first recessed portion inside the second container to cause an opening of the first recessed portion to be overlapped sequentially with the first to third connection ports; a third container connected to both a second pressurized gas supply line and the target substance lead-out path and configured to melt the solid target substance supplied from the third connection port; and a nozzle configured to output the melted target substance supplied from the third container.

20 Claims, 13 Drawing Sheets

FIG. 5

| S11 | VALVES V1 TO V3 ARE CLOSED |
|---|---|
| S12 | OPEN VALVE V2 |
| S13 | ADJUST INSIDE OF PRESSURE TANK C3 TO HIGH PRESSURE |
| S15 | PROCEED TO NEXT AFTER CERTAIN TIME PERIOD ELAPSES |
| S21 | CAUSE SECOND CONNECTION PORT P2 TO BE OVERLAPPED WITH OPENING 56 OF FIRST RECESSED PORTION 51 |
| S22 | ACTIVATE EXHAUST PUMP 63 AND OPEN VALVE V3 |
| S23 | CLOSE VALVE V3 AND STOP EXHAUST PUMP 63 |
| S31 | CLOSE VALVE V2 |
| S32 | OPEN VALVE V1 |
| S33 | OPEN VALVE V2 |
| S34 | CAUSE THIRD CONNECTION PORT P3 TO BE OVERLAPPED WITH OPENING 56 OF FIRST RECESSED PORTION 51 |
| S35 | CLOSE VALVE V1 |
| S41 | CAUSE FOURTH CONNECTION PORT P4 TO BE OVERLAPPED WITH OPENING 56 OF FIRST RECESSED PORTION 51 |
| S42 | CAUSE FIRST CONNECTION PORT P1 TO BE OVERLAPPED WITH OPENING 56 OF FIRST RECESSED PORTION 51 |
| S43 | RETURN TO S21 |

FIG. 11

| S11 | VALVES V1 TO V3 ARE CLOSED |
|---|---|
| S12 | OPEN VALVE V2 |
| S13 | ADJUST INSIDE OF PRESSURE TANK C3 TO HIGH PRESSURE |
| S15a | PROCEED TO NEXT WHEN CERTAIN TIME PERIOD ELAPSES AFTER LIQUID LEVEL HAS BECOME LOWER THAN DETECTION POSITION |
| S21 | CAUSE SECOND CONNECTION PORT P2 TO BE OVERLAPPED WITH OPENING 56 OF FIRST RECESSED PORTION 51 |
| S22 | ACTIVATE EXHAUST PUMP 63 AND OPEN VALVE V3 |
| S23 | CLOSE VALVE V3 AND STOP EXHAUST PUMP 63 |
| S31 | CLOSE VALVE V2 |
| S32 | OPEN VALVE V1 |
| S33 | OPEN VALVE V2 |
| S34 | CAUSE THIRD CONNECTION PORT P3 TO BE OVERLAPPED WITH OPENING 56 OF FIRST RECESSED PORTION 51 |
| S35 | CLOSE VALVE V1 |
| S41 | CAUSE FOURTH CONNECTION PORT P4 TO BE OVERLAPPED WITH OPENING 56 OF FIRST RECESSED PORTION 51 |
| S42 | CAUSE FIRST CONNECTION PORT P1 TO BE OVERLAPPED WITH OPENING 56 OF FIRST RECESSED PORTION 51 |
| S43a | RETURN TO S21 WHEN LIQUID LEVEL IS LOWER THAN DETECTION POSITION |
| S44a | RETURN TO S15a WHEN LIQUID LEVEL IS EQUAL TO OR HIGHER THAN DETECTION POSITION |

FIG. 13

| S11 | VALVES V1 TO V3 ARE CLOSED |
|---|---|
| S12 | OPEN VALVE V2 |
| S13 | ADJUST INSIDE OF PRESSURE TANK C3 TO HIGH PRESSURE |
| S14b | START MEASUREMENT OF AMOUNT OF OUTPUT TARGET SUBSTANCE |
| S15 | PROCEED TO NEXT AFTER CERTAIN TIME PERIOD ELAPSES |
| S21 | CAUSE SECOND CONNECTION PORT P2 TO BE OVERLAPPED WITH OPENING 56 OF FIRST RECESSED PORTION 51 |
| S22 | ACTIVATE EXHAUST PUMP 63 AND OPEN VALVE V3 |
| S23 | CLOSE VALVE V3 AND STOP EXHAUST PUMP 63 |
| S31 | CLOSE VALVE V2 |
| S32 | OPEN VALVE V1 |
| S33 | OPEN VALVE V2 |
| S34 | CAUSE THIRD CONNECTION PORT P3 TO BE OVERLAPPED WITH OPENING 56 OF FIRST RECESSED PORTION 51 |
| S35 | CLOSE VALVE V1 |
| S41 | CAUSE FOURTH CONNECTION PORT P4 TO BE OVERLAPPED WITH OPENING 56 OF FIRST RECESSED PORTION 51 |
| S42 | CAUSE FIRST CONNECTION PORT P1 TO BE OVERLAPPED WITH OPENING 56 OF FIRST RECESSED PORTION 51 |
| S43b | RETURN TO S21 WHEN AMOUNT OF REPLENISHED SOLID TARGET SUBSTANCE IS LESS THAN AMOUNT OF OUTPUT TARGET SUBSTANCE |
| S44b | RETURN TO S14b WHEN AMOUNT OF REPLENISHED SOLID TARGET SUBSTANCE IS EQUAL TO OR GREATER THAN AMOUNT OF OUTPUT TARGET SUBSTANCE |

TARGET SUPPLY DEVICE, TARGET SUPPLY METHOD, AND ELECTRONIC DEVICE MANUFACTURING METHOD

CROSS-REFERENCE TO RELATED APPLICATIONS

The application claims the benefit of Japanese Unexamined Patent Application No. 2020-108505, filed on Jun. 24, 2020, the entire contents of which are hereby incorporated by reference.

BACKGROUND

1. Technical Field

The present disclosure relates to a target supply device, a target supply method, and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 70 to 45 nm and further at 32 nm or less will be required. Therefore, in order to meet the demand for fine processing of, for example, 32 nm or less, the development of an exposure apparatus that combines an extreme ultraviolet (EUV) light generation apparatus that generates EUV light having a wavelength of about 13 nm and reduced projection reflection optics is expected.

As an EUV light generation apparatus, three types of apparatuses have been proposed: a laser produced plasma (LPP) type apparatus using plasma generated by irradiating a target substance with pulsed laser light, a discharge produced plasma (DPP) type apparatus using plasma generated by discharge, and a synchrotron radiation (SR) type apparatus using synchrotron radiation.

LIST OF DOCUMENTS

Patent Documents

Patent Document 1: Japanese Patent Application Publication No. 2015-053292
Patent Document 2: Japanese Patent Application Publication No. H09-217849
Patent Document 3: Japanese Patent Application Publication No. 2001-315962
Patent Document 4: Japanese Patent Application Publication No. H06-275535
Patent Document 5: US Patent Application Publication No. 2017/0350745

Non-Patent Document

Non-patent Document 1: Japanese Ball Valve General Catalog, October 2016, P. 23-24

SUMMARY

A target supply device according to an aspect of the present disclosure includes a first container configured to contain a solid target substance; a second container including a first connection port connected to the first container, a second connection port connected to a first pressurized gas supply line, and a third connection port connected to a target substance lead-out path; a moving body including a first recessed portion configured to contain the solid target substance supplied from the first container and move the first recessed portion inside the second container to cause an opening of the first recessed portion to be overlapped sequentially with the first connection port, the second connection port, and the third connection port; a third container connected to both a second pressurized gas supply line and the target substance lead-out path and configured to melt the solid target substance supplied from the third connection port; and a nozzle configured to output the melted target substance supplied from the third container.

A target supply method according to an aspect of the present disclosure, with an extreme ultraviolet light generation apparatus using a target supply device, includes causing, by a moving body, an opening of a first recessed portion to be overlapped with a first connection port, then to be overlapped with a second connection port, and then to be overlapped with a third connection port. Here, the target supply device includes a first container configured to contain a solid target substance; a second container including the first connection port connected to the first container, the second connection port connected to a first pressurized gas supply line, and the third connection port connected to a target substance lead-out path; the moving body including the first recessed portion configured to contain the solid target substance supplied from the first container and move the first recessed portion inside the second container; a third container connected to both a second pressurized gas supply line and the target substance lead-out path and configured to melt the solid target substance supplied from the third connection port; and a nozzle configured to output the melted target substance supplied from the third container.

An electronic device manufacturing method according to an aspect of the present disclosure includes generating extreme ultraviolet light by irradiating a target substance with pulsed laser light in an extreme ultraviolet light generation apparatus, emitting the extreme ultraviolet light to an exposure apparatus, and exposing a photosensitive substrate to the extreme ultraviolet light in the exposure apparatus to manufacture an electronic device. Here, the extreme ultraviolet light generation apparatus includes a target supply device, and a laser light concentrating mirror configured to concentrate pulsed laser light on the target substance output to a predetermined region from the target supply device. The target supply device includes a first container configured to contain a solid target substance; a second container including a first connection port connected to the first container, a second connection port connected to a first pressurized gas supply line, and a third connection port connected to a target substance lead-out path; a moving body including a first recessed portion configured to contain the solid target substance supplied from the first container and move the first recessed portion inside the second container; a third container connected to both a second pressurized gas supply line and the target substance lead-out path and configured to melt the solid target substance supplied from the third connection port; and a nozzle configured to output the melted target substance supplied from the third container.

BRIEF DESCRIPTION OF THE DRAWINGS

Embodiments of the present disclosure will be described below merely as examples with reference to the accompanying drawings.

FIG. 5 illustrates operation procedure of the target supply device according to the first embodiment.

FIG. 11 illustrates operation procedure of the target supply device according to the third embodiment.

FIG. 13 illustrates operation procedure of the target supply device according to the fourth embodiment.

DESCRIPTION OF EMBODIMENTS

Figure 1:
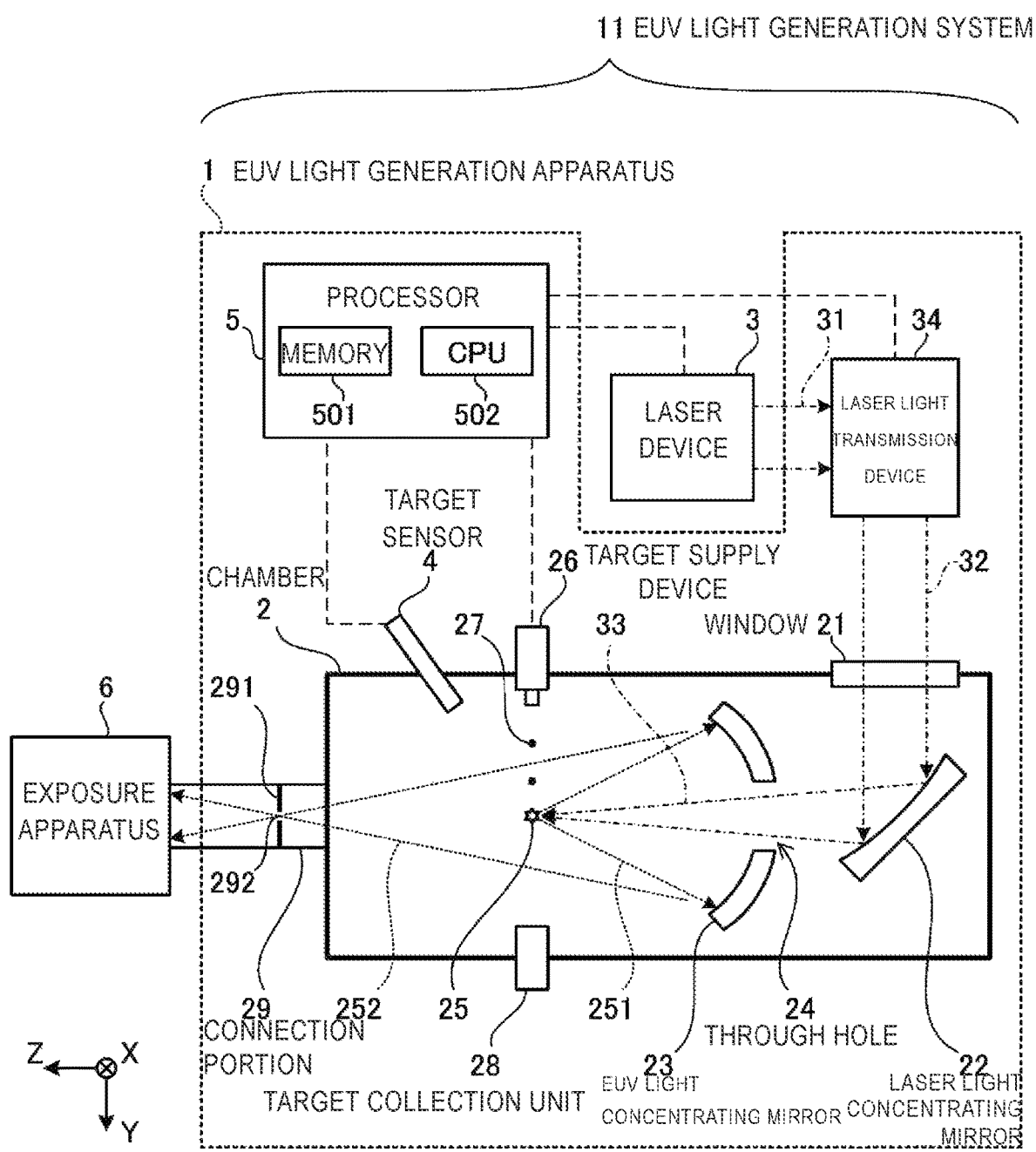
FIG. 1 schematically illustrates an exemplary configuration of an LPP EUV light generation system.

<Contents>
1. Overall description of EUV light generation system 11
   1.1 Configuration
   1.2 Operation
2. Comparative example
   2.1 Configuration and operation
   2.2 Problem
3. Target supply device 261 replenishing solid target substance 27a via ball valve 59
   3.1 Configuration
      3.1.1 Reservoir tank C1
      3.1.2 Ball valve 59
      3.1.3 Lines
   3.2 Operation
      3.2.1 Operation of ball valve 59
      3.2.2 Operation of replenishing solid target substance 27a
   3.3 Modified example
      3.3.1 First recessed portion 54 containing plurality of solid target substances 27a
      3.3.2 Ball portion 50b having second recessed portion 52
      3.3.3 Ball portion 50c having second to M-th recessed portions
   3.4 Effect
4. Body portion C4 with fifth connection port P5 for forcible exhaust
   4.1 Configuration
   4.2 Operation
   4.3 Effect
5. Target supply device 263 replenishing solid target substance 27a while measuring liquid level in pressure tank C3
   5.1 Configuration
   5.2 Operation
   5.3 Effect
6. Target supply device 264 measuring amount of output target substance and replenishing solid target substance 27a
   6.1 Configuration
   6.2 Operation
   6.3 Effect
7. Others Hereinafter, embodiments of the present disclosure will be described in detail with reference to the drawings. The embodiments described below illustrate some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overall Description of EUV Light Generation System 11

1.1 Configuration

FIG. 1 schematically illustrates an exemplary configuration of an LPP EUV light generation system 11. An EUV light generation apparatus 1 is used with a laser device 3. In the present disclosure, a system including the EUV light generation apparatus 1 and the laser device 3 is referred to as an EUV light generation system 11. The EUV light generation apparatus 1 includes a chamber 2 and a target supply device 26. The chamber 2 is a sealable container. The target supply device 26 supplies target substance into the chamber 2. The material of the target substance may include tin, terbium, gadolinium, lithium, xenon, or a combination of any two or more thereof.

A through hole is formed in a wall of the chamber 2. The through hole is blocked by a window 21 through which pulsed laser light 32 emitted from the laser device 3 passes. An EUV light concentrating mirror 23 having a spheroidal reflection surface is disposed in the chamber 2. The EUV light concentrating mirror 23 has first and second focal points. A multilayer reflection film in which molybdenum and silicon are alternately stacked is formed on a surface of the EUV light concentrating mirror 23. The EUV light concentrating mirror 23 is disposed so that the first focal point is located in a plasma generation region 25 and the second focal point is located at an intermediate focal point 292. A through hole 24 is formed at the center of the EUV light concentrating mirror 23, and pulsed laser light 33 passes through the through hole 24.

The EUV light generation apparatus 1 includes a processor 5, a target sensor 4, and the like. The processor 5 is a processing device including a memory 501 in which a control program is stored, and a central processing unit (CPU) 502 for executing the control program. The processor 5 is specifically configured or programmed to perform various processes included in the present disclosure. The target sensor 4 detects at least one of the presence, trajectory, position, and velocity of a target 27. The target sensor 4 may have an imaging function.

Further, the EUV light generation apparatus 1 includes a connection portion 29 providing communication between an internal space of the chamber 2 and an internal space of the exposure apparatus 6. A wall 291 in which an aperture is formed is disposed in the connection portion 29. The wall 291 is arranged so that the aperture is located at the second focal point of the EUV light concentrating mirror 23.

Furthermore, the EUV light generation apparatus 1 includes a laser light transmission device 34, a laser light concentrating mirror 22, a target collection unit 28 for collecting the target 27, and the like. The laser light transmission device 34 includes an optical element for defining a transmission state of laser light, and an actuator for adjusting the position, posture, and the like of the optical element.

1.2 Operation

Operation of the EUV light generation system 11 will be described with reference to FIG. 1. Pulsed laser light 31 emitted from the laser device 3 enters, via the laser light transmission device 34, the chamber 2 through the window 21 as the pulsed laser light 32. The pulsed laser light 32 travels along a laser light path in the chamber 2, is reflected by the laser light concentrating mirror 22, and is radiated to the target 27 as the pulsed laser light 33.

The target supply device 26 outputs the target 27 containing target substance toward a plasma generation region 25 in the chamber 2. The target 27 is irradiated with the pulsed laser light 33. The target 27 irradiated with the pulsed laser light 33 is turned into plasma, and radiation light 251 is radiated from the plasma. The EUV light contained in the radiation light 251 is reflected by the EUV light concentrating mirror 23 with a higher reflectivity than light in other wavelength ranges. Reflection light 252 including the EUV light reflected by the EUV light concentrating mirror 23 is concentrated at the intermediate focal point 292 and emitted to the exposure apparatus 6. Here, one target 27 may be irradiated with a plurality of pulses included in the pulsed laser light 33.

The processor 5 controls the entire EUV light generation system 11. The processor 5 processes a detection result of the target sensor 4. Based on the detection result of the target sensor 4, the processor 5 controls timing at which the target 27 is output, an output direction of the target 27, and the like. Further, the processor 5 controls oscillation timing of the laser device 3, a travel direction of the pulsed laser light 32, the concentration position of the pulsed laser light 33, and the like. Such various kinds of control described above are merely exemplary, and other control may be added as necessary.

2. Comparative Example

2.1 Configuration and Operation

Figure 2:
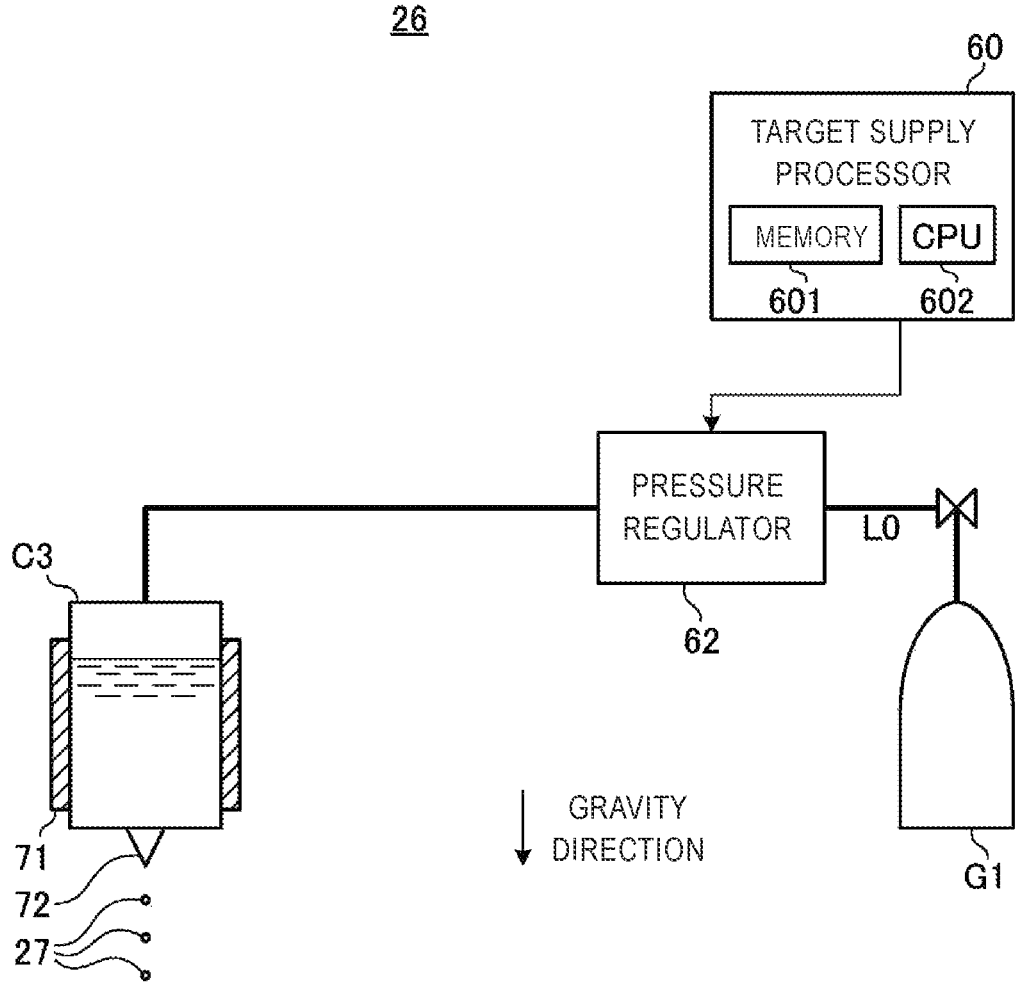
FIG. 2 schematically illustrates a configuration of a target supply device according to a comparative example.

FIG. 2 schematically illustrates a target supply device 26 according to a comparative example. The comparative example of the present disclosure is an example recognized by the applicant as known only by the applicant, and is not a publicly known example admitted by the applicant. As illustrated in FIG. 2, the comparative target supply device 26 includes a pressure tank C3, a target supply processor 60, and a pressure regulator 62. The target supply processor 60 is a processing device including a memory 601 in which the control program is stored and a CPU 602 for executing the control program. The target supply processor 60 corresponds to the processor in the present disclosure. The target supply processor 60 is specifically configured or programmed to perform the various processes included in the present disclosure.

The pressure tank C3 is a container for containing the target substance. The pressure tank C3 corresponds to the third container in the present disclosure. The pressure tank C3 is connected to a gas cylinder G1 via a pressurized gas line L0. The gas cylinder G1 contains a high-pressure rare gas such as an argon gas or a helium gas as a pressurized gas.

The pressure regulator 62 is disposed at the pressurized gas line L0. The target supply processor 60 controls the pressure regulator 62 based on an output of a pressure meter (not illustrated), so that the pressure in the pressure tank C3 is adjusted to a predetermined pressure higher than the atmospheric pressure.

A heater 71 and a nozzle 72 are disposed at the pressure tank C3.

The heater 71 is connected to a power source (not illustrated), and heats the inside of the pressure tank C3 to a predetermined temperature higher than the melting point of the target substance. The temperature in the pressure tank C3 is controlled by controlling the power source based on the output of a temperature sensor (not illustrated) disposed at the pressure tank C3.

The nozzle 72 is disposed at a lower end portion of the pressure tank C3 in the gravity direction. The tip of the nozzle 72 is opened to the inside of the chamber 2 (see FIG. 1). The target substance melted by the heater 71 is output from the opening at the tip of the nozzle 72 owing to the pressure difference between the pressurized gas supplied from the pressure regulator 62 and the pressure in the chamber 2. When vibration is applied to the nozzle 72 by a piezoelectric element (not illustrated), a jet-shaped target substance (not illustrated) output from the nozzle 72 is separated into droplets and becomes the targets 27.

2.2 Problem

When all of the target substance inside the pressure tank C3 is output from the nozzle 72, the target supply device 26 needs to be replaced. The operation of replacing the target supply device 26 includes a process of lowering the temperature of the inside of the pressure tank C3 heated by the heater 71, and a start-up process of raising the temperature and pressurizing the inside of the pressure tank C3 after a new target supply device 26 is installed. Since EUV light cannot be generated by the EUV light generation apparatus 1 during the replacement operation, the operation rate of the EUV light generation apparatus 1 is reduced by performing the replacement operation.

In the embodiments described below, the pressure tank C3 can be replenished with the target substance while continuing the output of the target 27 from the nozzle 72, thereby suppressing a decrease in the operation rate of the EUV light generating apparatus 1.

3. Target Supply Device 261 Replenishing Solid Target Substance 27a Via Ball Valve 59

3.1 Configuration

Figure 3:
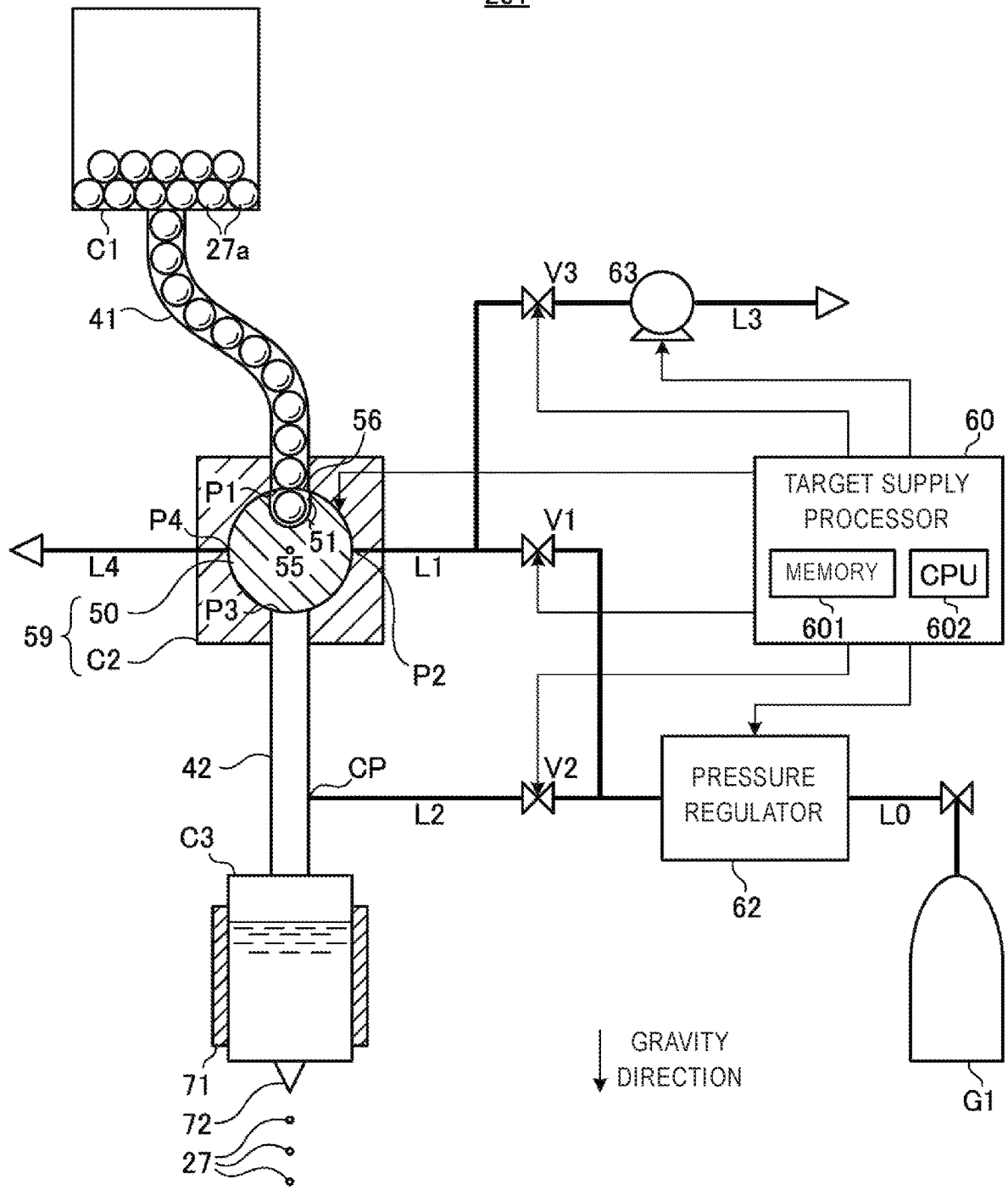
FIG. 3 schematically illustrates a configuration of a target supply device according to a first embodiment.

FIG. 3 schematically illustrates a configuration of a target supply device 261 according to a first embodiment. The target supply device 261 includes a reservoir tank C1 and a ball valve 59.

3.1.1 Reservoir Tank C1

The reservoir tank C1 is a container containing solid target substances 27a. The solid target substance 27a is composed of, for example, highly pure tin. The solid target substance 27a may be, for example, spherical particles of substantially the same size. The reservoir tank C1 corresponds to the first container in the present disclosure. The temperature in the reservoir tank C1 is lower than the melting point of the target substance. An argon gas, a helium gas, or a dry air is supplied as a purge gas to the reservoir tank C1 so as to suppress oxidation of the solid target substance 27a. The pressure in the reservoir tank C1 is substantially equal to the atmospheric pressure.

The reservoir tank C1 is connected to the ball valve 59 via an introduction path 41. The introduction path 41 allows the solid target substance 27a in the reservoir tank C1 to pass therethrough and supplies the solid target substance 27a to the ball valve 59.

3.1.2 Ball Valve 59

The ball valve 59 includes a body portion C2 and a ball portion 50.

The body portion C2 is a container, of which an inner wall has a circular cross section. The cross section is parallel to the plane of the paper of FIG. 3. The body portion C2 includes a first connection port P1, a second connection port P2, a third connection port P3, and a fourth connection port P4 arranged in this order along the circumference of the cross section. The first connection port P1 is connected to the reservoir tank C1 via the introduction path 41. The second connection port P2 is connected to the gas supply line L1. The third connection port P3 is connected to a lead-out path 42. The fourth connection port P4 is connected to an exhaust line L4. The body portion C2 corresponds to the second container in the present disclosure. The gas supply line L1 corresponds to the first pressurized gas supply line in the present disclosure. The lead-out path 42 corresponds to the target substance lead-out path in the present disclosure. The temperature inside the body portion C2 is lower than the melting point of the target substance.

The ball portion 50 has a circular cross section and is disposed inside the body portion C2. The ball portion 50 has a spherical or cylindrical shape. The ball portion 50 has a first recessed portion 51. A part of an opening 56 of the first recessed portion 51 is located in the above-described cross section. A seal portion (not illustrated) in contact with the surface of the ball portion 50 is formed around each of the first to fourth connection ports P1 to P4 at the inner wall surface of the body portion C2.

The ball portion 50 is configured to be rotatable about a rotation axis 55 by a drive device (not illustrated). Thus, the first recessed portion 51 is rotatable about the rotation axis 55. The rotation axis 55 is perpendicular to the above-described cross section. That is, the rotation axis 55 is perpendicular to the plane of the paper of FIG. 3. The ball portion 50 corresponds to the moving body in the present disclosure.

3.1.3 Lines

The pressure tank C3 is connected to both the lead-out path 42 and the gas supply line L2. The gas supply line L2 corresponds to the second pressurized gas supply line in the present disclosure.

As illustrated in FIG. 3, the gas supply line L2 may be connected to the pressure tank C3 by being connected at a connection position CP to the lead-out path 42. In this case, a heat insulating mechanism (not illustrated) may be provided, in the lead-out path 42, at a position between the connection position CP and the pressure tank C3.

Alternatively, the lead-out path 42 and the gas supply line L2 may be directly connected to the pressure tank C3, respectively. In this case, a heat insulating mechanism (not illustrated) may be provided in the gas supply line L2 in addition to the heat insulating mechanism (not illustrated) provided in the lead-out path 42.

A valve V1 is disposed in the gas supply line L1, and a valve V2 is disposed in the gas supply line L2. The valve V1 corresponds to the first valve in the present disclosure, and the valve V2 corresponds to the second valve in the present disclosure. The gas supply line L1 and the gas supply line L2 are connected to the pressurized gas line L0. The pressure regulator 62 disposed in the pressurized gas line L0 adjusts the gas pressure in both the gas supply line L1 and the gas supply line L2.

A forcible exhaust line L3 is connected, at the gas supply line L1, to a position between the second connection port P2 and the valve V1. Thus, the second connection port P2 is connected to both the gas supply line L1 and the forcible exhaust line L3. A valve V3 and an exhaust pump 63 are disposed in the forcible exhaust line L3. The exhaust pump 63 is configured to forcibly exhaust the gas inside the first recessed portion 51 when the first recessed portion 51 is positioned on the second connection port P2, so that the pressure inside the first recessed portion 51 can become lower than the atmospheric pressure.

The exhaust line L4 is configured to exhaust the gas inside the first recessed portion 51 to the outside when the first recessed portion 51 is positioned at the fourth connection port P4 so that the pressure inside the first recessed portion 51 can be close to the atmospheric pressure.

3.2 Operation

3.2.1 Operation of ball valve 59

FIGS. 4A to 4D are sectional views illustrating operation of the ball valve 59 in the first embodiment. The solid target substance 27a inside the reservoir tank C1 passes through the introduction path 41 and reaches the vicinity of the first connection port P1 of the body portion C2. In the following manner, the first recessed portion 51 rotates in a certain rotation direction, and the opening 56 is overlapped sequentially with the first to fourth connection ports P1 to P4, so that the solid target substance 27a moves to the lead-out path 42.

Figure 4A:
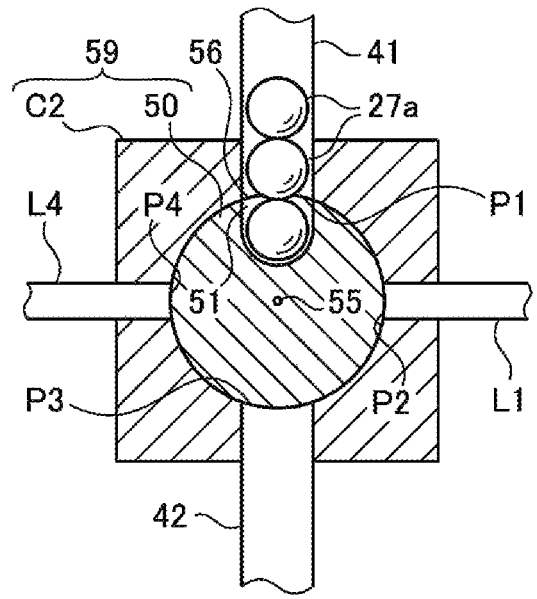
FIGS. 4A to 4D are sectional views illustrating operation of a ball valve in a first embodiment.

As illustrated in FIG. 4A, when the opening 56 is overlapped with the first connection port P1, one solid target substance 27a is moved to the first recessed portion 51 by gravity. The volume of the first recessed portion 51 is slightly larger than the volume of one solid target substance 27a, so that only one solid target substance 27a enters the first recessed portion 51. The pressure inside the first recessed portion 51 is substantially equal to the pressure inside the reservoir tank C1, and is, for example, about the same as the atmospheric pressure.

Figure 4B:
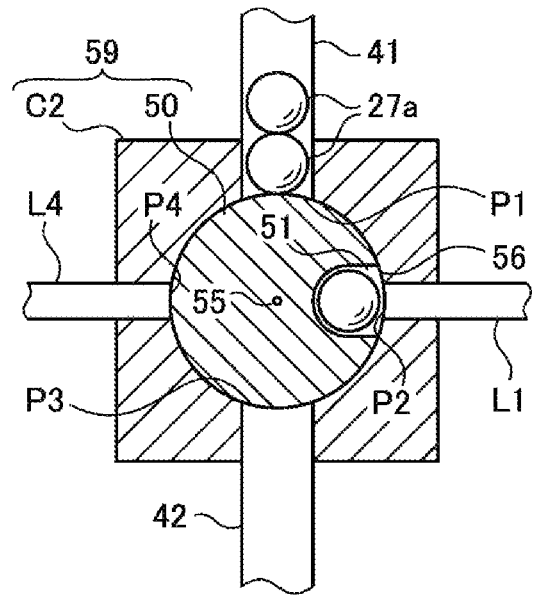

As illustrated in FIG. 4B, when the ball portion 50 rotates, the opening 56 is overlapped with the second connection port P2. The gas supply line L1 connected to the second connection port P2 supplies at least the pressurized gas to the first recessed portion 51. As a result, the pressure inside the first recessed portion 51 is increased to be close to the pressure inside the pressure tank C3 (see FIG. 3).

When the opening 56 is overlapped with the second connection port P2, the inside of the first recessed portion 51 may be forcibly exhausted by the forcible exhaust line L3 (see FIG. 3), and then the pressurized gas may be supplied to the first recessed portion 51 as described above. The operation of supplying the pressurized gas after the forcible exhaust will be described later with reference to FIG. 5.

Figure 4C:
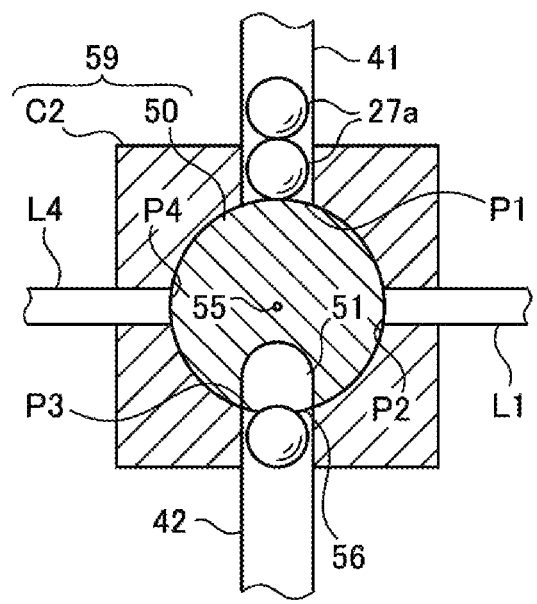

As illustrated in FIG. 4C, the opening 56 is overlapped with the third connection port P3 by further rotation of the ball portion 50. As a result, the solid target substance 27a moves from the third connection port P3 to the lead-out path 42 by gravity, and is then supplied to the pressure tank C3. The solid target substance 27a supplied to the pressure tank C3 melts inside the pressure tank C3 and mixes with the target substance already contained and melted in the pressure tank C3. The heater 71 suppresses a decrease in the internal temperature of the pressure tank C3.

Figure 4D:
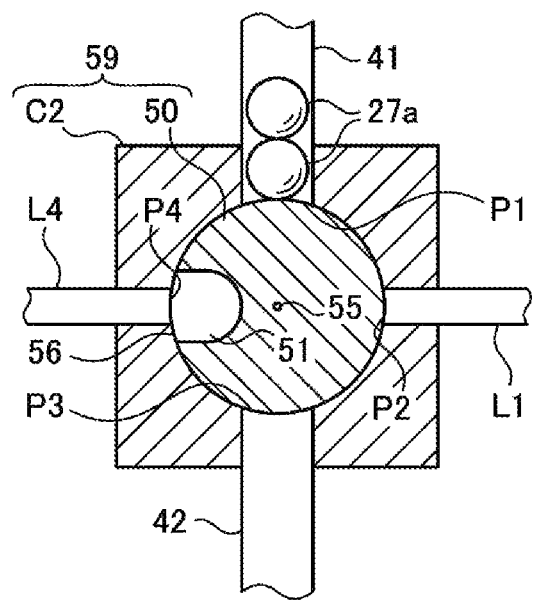

As illustrated in FIG. 4D, the opening 56 is overlapped with the fourth connection port P4 by further rotation of the ball portion 50. Thus, high-pressure gas inside the first recessed portion 51 is released into the exhaust line L4, and the pressure inside the first recessed portion 51 is returned to be close to the atmospheric pressure.

As illustrated in FIG. 4A, when the opening 56 is overlapped with the first connection port P1 again, the next solid target substance 27a is contained in the first recessed portion 51.

Since the solid target substance 27a passes through each of the first connection port P1, the third connection port P3, and the opening 56, the diameter of the solid target substance 27a is preferably smaller than the widths of any of the first connection port P1, the third connection port P3, and the opening 56. In the present disclosure, the "width" of the connection port or the opening means a distance between two parallel lines which are in contact with both sides of the connection port or the opening as being the shortest distance therebetween. For example, if the connection port or the opening is elliptical, the width corresponds to the length of the minor axis of the ellipse.

In order to prevent the solid target substance 27a from entering the second connection port P2 when the opening 56 is overlapped with the second connection port P2, the width of the second connection port P2 is desirably smaller than the diameter of the solid target substance 27a. The width of the second connection port P2 is, for example, 0.01 times or more and 0.9 times or less than the diameter of the solid target substance 27a. The second connection port P2 preferably has smaller area than any of the first connection port P1, the third connection port P3, and the opening 56.

3.2.2 Operation of Replenishing Solid Target Substance 27a

FIG. 5 illustrates operation procedure of the target supply device 261 according to the first embodiment. In the first embodiment, the target supply device 261 starts outputting of the target 27 from the nozzle 72 as follows. After the target substance is consumed, the pressure tank C3 is replenished with the solid target substance 27a inside the reservoir tank C1 via the ball valve 59.

In S11, the operation starts from a state in which all of the valves V1 to V3 are closed. At this time, the opening 56 of the first recessed portion 51 is overlapped with the first connection port P1, and one solid target substance 27a is contained in the first recessed portion 51. The heater 71 heats the inside of the pressure tank C3 to a predetermined temperature higher than the melting point of the target substance.

In S12, the target supply processor 60 opens the valve V2. Thus, the pressurized gas stored in the gas cylinder G1 is supplied to the pressure tank C3.

In S13, the target supply processor 60 controls the pressure regulator 62 to adjust the pressure in the pressure tank C3 to a predetermined pressure higher than the atmospheric pressure. As a result, the target supply device 261 starts outputting the target 27 from the nozzle 72, and consumption of the target substance is started.

In S15, the target supply processor 60 waits until the target substance is consumed while a certain time period elapses, and processing proceeds to the next step after the certain time period elapses.

In S21, the target supply processor 60 causes the opening 56 to be overlapped with the second connection port P2.

In S22, the target supply processor 60 activates the exhaust pump 63 and then opens the valve V3. The gas contained in the first recessed portion 51 is thereby exhausted to the outside.

In S23, the target supply processor 60 closes the valve V3 and then stops the exhaust pump 63.

In S31, the target supply processor 60 closes the valve V2.

Thereafter, in S32, the target supply processor 60 opens the valve V1. By opening the valve V1, the pressurized gas is supplied to the first recessed portion 51. The pressure inside the first recessed portion 51 is substantially equal to the pressure inside the pressure tank C3.

In S33, the target supply processor 60 opens the valve V2.

In S34, the target supply processor 60 causes the opening 56 to be overlapped with the third connection port P3. As a result, the solid target substance 27a in the first recessed portion 51 is supplied to the pressure tank C3. Since the pressurized gas is supplied to the inside of the first recessed portion 51 in S32, the pressure fluctuation inside the pressure tank C3 when the opening 56 is overlapped with the third connection port P3 can be reduced. Even when a slight pressure fluctuation occurs, adjusting to the desired pressure is performed while the pressurized gas is supplied via the valve V2.

In S35, the target supply processor 60 closes the valve V1.

In S41, the target supply processor 60 causes the opening 56 to be overlapped with the fourth connection port P4. As a result, the pressure inside the first recessed portion 51 is substantially equal to the atmospheric pressure.

In S42, the target supply processor 60 causes the opening 56 to be overlapped with the first connection port P1. Thus, the next solid target substance 27a is contained in the first recessed portion 51. In S43, the target supply processor 60 returns to the process of S21.

Figure 6:
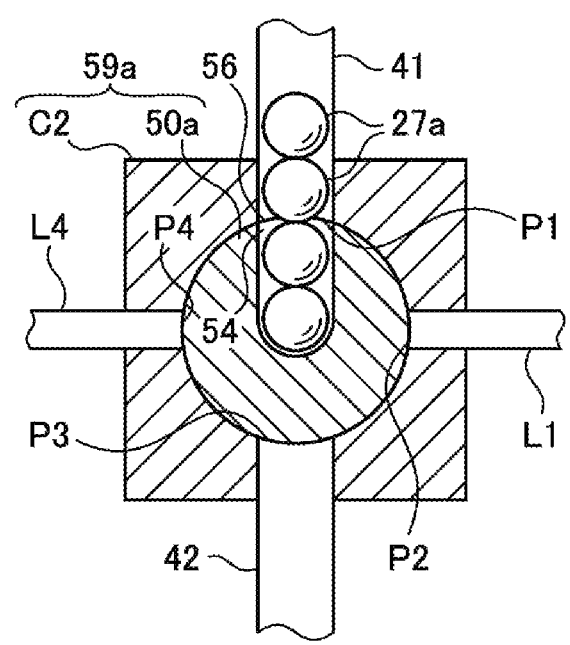
FIG. 6 is a sectional view of a ball valve in a first modified example.

3.3 Modified Example 3.3.1 First Recessed Portion 54 Containing a Plurality of Solid Target Substances 27a FIG. 6 is a sectional view of a ball valve 59a in the first modified example. A ball portion 50a included in the ball valve 59a has the first recessed portion 54. In the example illustrated in FIGS. 4A to 4D, the first recessed portion 51 contains one solid target substance 27a, whereas in the first modified example illustrated in FIG. 6, the first recessed portion 54 contains a plurality of solid target substances 27a.

As illustrated in FIGS. 4A to 4D and FIG. 6, the first recessed portion 51 or 54 may be capable of containing N solid target substances 27a, where N may be an integer equal to or greater than 1. The ball portion 50 or 50a supplies N solid target substances 27a to the third connection port P3 every time the first recessed portion 51 or 54 makes one rotation.

3.3.2 Ball Portion 50b Having Second Recessed Portion 52

Figure 7:
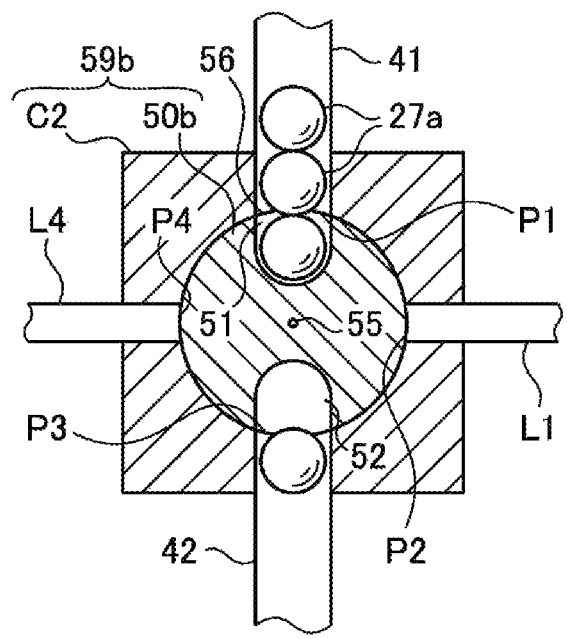
FIG. 7 is a sectional view of a ball valve in a second modified example.

FIG. 7 is a sectional view of a ball valve 59b in the second modified example. A ball portion 50b included in the ball valve 59b has the first recessed portion 51 and a second recessed portion 52. The first recessed portion 51 and the second recessed portion 52 are located on opposite sides of the rotation axis 55. The rotation of the ball portion 50b causes the first recessed portion 51 and the second recessed portion 52 to be rotated concurrently about the rotation axis 55. Almost at the same time when the solid target substance 27a enters one of the first recessed portion 51 and the second recessed portion 52 from the first connection port P1, another solid target substance 27a is supplied to the third connection port P3 from the other of the first recessed portion 51 and the second recessed portion 52.

In the example illustrated in FIGS. 4A to 4D, one solid target substance 27a is supplied to the third connection port P3 every time the ball portion 50 makes one rotation, whereas in the second modified example illustrated in FIG. 7, one solid target substance 27a is supplied to the third connection port P3 every time the ball portion 50b makes half rotation. That is, every time the ball portion 50b makes one rotation, two solid target substances 27a are supplied to the third connection port P3.

In the second modified example, each of the first recessed portion 51 and the second recessed portion 52 may contain one solid target substance 27a or a plurality of solid target substances 27a. That is, N solid target substances 27a can be contained in each of the first recessed portion 51 and the second recessed portion 52, where N may be 1 or an integer equal to or greater than 2. In the case where each of the first recessed portion 51 and the second recessed portion 52 can contain N solid target substances 27a, N×2 solid target substances 27a are supplied to the third connection port P3 every time the ball portion 50b makes one rotation.

3.3.3 Ball Portion 50c Having Second to M-Th Recessed Portions

Figure 8:
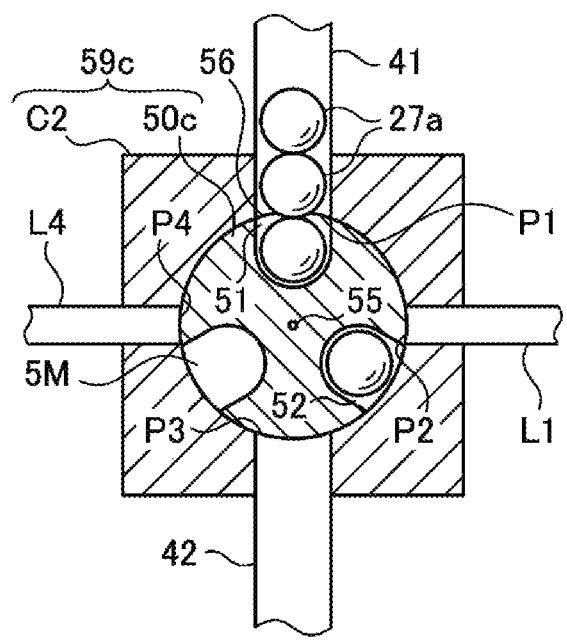
FIG. 8 is a sectional view of a ball valve in a third modified example.

FIG. 8 is a sectional view of the ball valve 59c in the third modified example. A ball portion 50c included in the ball valve 59c has first to M-th recessed portions 51 to 5M. The first to M-th recessed portions 51 to 5M are arranged at equal intervals on a circumference around the rotation axis 55. As the ball portion 50c rotates, the first to M-th recessed portions 51 to 5M rotate simultaneously about the rotation axis 55. M is an integer equal to or greater than 3.

In the third modified example illustrated in FIG. 8, one solid target substance 27a is supplied to the third connection port P3 every time the ball portion 50c makes 1/M rotation. That is, every time the ball portion 50c makes one rotation, M solid target substances 27a are supplied to the third connection port P3.

In the third modified example, each of the first to M-th recessed portions 51 to 5M may be configured to contain one solid target substance 27a or a plurality of solid target substances 27a. That is, N solid target substances 27a can be contained in each of the first to M-th recessed portions 51 to 5M, and N may be 1 or an integer equal to or greater than 2. When N solid target substances 27a can be contained in each of the first to M-th recessed portions 51 to 5M, N×M solid target substances 27a are supplied to the third connection port P3 every time the ball portion 50c makes one rotation.

3.4 Effect

According to the first embodiment, the solid target substance 27a contained in the reservoir tank C1, which is substantially at the atmospheric pressure, can be supplied into the pressure tank C3 having high pressure. Even when the target substance in the pressure tank C3 is consumed, the solid target substance can be replenished without replacing the pressure tank C3, so that the downtime of the EUV light generation apparatus 1 can be reduced.

(1) According to the first embodiment, the target supply device 261 includes the reservoir tank C1, the body portion C2, the ball portion 50, the pressure tank C3, and the nozzle 72. The reservoir tank C1 contains the solid target substances 27a. The body portion C2 includes a first connection port P1 connected to the reservoir tank C1, a second connection port P2 connected to the gas supply line L1, and a third connection port P3 connected to the lead-out path 42. The ball portion 50 includes a first recessed portion 51 for containing the solid target substance 27a supplied from the reservoir tank C1, and by moving the first recessed portion 51 inside the body portion C2, the opening 56 of the first recessed portion 51 is overlapped sequentially with the first connection port P1, the second connection port P2, and the third connection port P3. The pressure tank C3 is connected to both the gas supply line L2 and the lead-out path 42, and melts the solid target substance 27a supplied from the third connection port P3. The nozzle 72 outputs the molten target substance supplied from the pressure tank C3.

By causing the opening 56 to be overlapped with the second connection port P2 connected to the gas supply line L1, the pressurized gas can be supplied to the first recessed portion 51. As a result, it is possible to suppress the pressure fluctuation inside the pressure tank C3 when the opening 56 is overlapped with the third connection port P3 connected to the lead-out path 42.

The moving speed of the target 27 output from the nozzle 72 depends on the pressure difference between the inside of the pressure tank C3 and the inside of the chamber 2. By suppressing the pressure fluctuation inside the pressure tank C3, the change in the moving speed of the target 27 is suppressed. By suppressing the change in the moving speed of the target 27, the variation in the position of the target 27 when the target 27 is irradiated with the pulsed laser light 33 (see FIG. 1) is reduced, and the target 27 can be accurately irradiated with the pulsed laser light 33. Therefore, the quality of the EUV light can be stabilized.

(2) According to the first embodiment, the second connection port P2 is connected to both the forcible exhaust line L3 and the gas supply line L1.

Thus, the pressurized gas can be supplied to the first recessed portion 51 after the first recessed portion 51 is forcibly exhausted. Therefore, the gas component flowing into the first recessed portion 51 from the reservoir tank C1 is suppressed from flowing into the pressure tank C3 from the first recessed portion 51. In this case, the choice of the purge gas used for the reservoir tank C1 is widened. That is, a rare gas may be selected as the purge gas in consideration of the fact that a portion of the purge gas flows to the pressure tank C3, or dry air may be selected as the purge gas by assuming that the amount of the purge gas flowing to the pressure tank C3 is sufficiently small. Although the oxygen gas contained in the dry air may oxidize the liquid tin inside the pressure tank C3, the oxidation of the liquid tin inside the pressure tank C3 is suppressed by forcibly exhausting the first recessed portion 51.

(3) According to the first embodiment, the width of the second connection port P2 is smaller than the diameter of the solid target substance 27a supplied from the reservoir tank C1.

This prevents the solid target substance 27a from passing through the second connection port P2.

(4) According to the first embodiment, the second connection port P2 has smaller area than any of the first connection port P1, the third connection port P3, and the opening 56.

This prevents the solid target substance 27a that can pass through the first connection port P1, the third connection port P3, and the opening 56 from passing through the second connection port P2.

(5) According to the first embodiment, the gas supply line L2 is connected to the pressure tank C3 by being connected to the lead-out path 42.

In this case, if a heat insulating mechanism (not illustrated) is provided between the pressure tank C3 having high temperature and the connection position CP between the gas supply line L2 and the lead-out path 42, a heat insulating mechanism may not be provided in the gas supply line L2. Alternatively, it is possible to select, for the gas supply line L2, a material that emphasizes performance other than thermal insulation performance.

(6) According to the first embodiment, the target supply device 261 further includes the pressurized gas line L0, the valves V1 and V2, and the target supply processor 60. The pressurized gas line L0 is a common pressurized gas line L0 for supplying pressurized gas to the gas supply line L1 and the gas supply line L2. The valve V1 is disposed in the gas supply line L1, and the valve V2 is disposed in the gas supply line L2. The target supply processor 60 controls the valve V1, the valve V2, and the ball portion 50 as follows. That is, the opening 56 is overlapped with the second connection port P2 (S21) and, in a state where the valve V2 is closed (S31), the valve V1 is opened (S32) to supply the pressurized gas to the first recessed portion 51. Thereafter, the opening 56 is overlapped with the third connection port P3 (S34), and the solid target substance 27a is supplied from the first recessed portion 51 to the pressure tank C3.

Accordingly, since the common pressurized gas line L0 is connected to the gas supply line L1 and the gas supply line L2, the difference in pressure between the first recessed portion 51 and the pressure tank C3 can be reduced. Therefore, it is possible to suppress the pressure fluctuation inside the pressure tank C3 when the opening 56 is overlapped with the third connection port P3 in S34.

When the valve V1 is opened in S32, if the valve V2 is opened, there is a possibility that the gas inside the pressure tank C3 flows into the first recessed portion 51, which is at or below the atmospheric pressure, via the valve V2 and the valve V1. In this case, there is a possibility that the pressure inside the pressure tank C3 fluctuates and the moving speed of the target 27 is changed. By closing the valve V2 in S31 before S32, it is possible to suppress the pressure fluctuation inside the pressure tank C3 when the valve V1 is opened.

(7) According to the first embodiment, the body portion C2 further includes the fourth connection port P4 connected to the exhaust line L4. The ball portion 50 causes the opening 56 to be overlapped sequentially with the first connection port P1, the second connection port P2, the third connection port P3, and the fourth connection port P4.

Accordingly, when the opening 56 is overlapped with the fourth connection port P4 in S41, the first recessed portion 51 is exhausted. In this case, when the opening 56 is overlapped with the first connection port P1 in S42, the high pressure gas is prevented from being ejected from the first connection port P1 toward the reservoir tank C1.

(8) According to the first embodiment, the inner wall surface of the body portion C2 has a circular cross section, and the ball portion 50 rotates the first recessed portion 51 about the rotation axis 55 perpendicular to the cross section.

Owing to that a rotational type is adopted for the movement of the first recessed portion 51 by the ball portion 50, it is possible to simplify the mechanism for moving the first recessed portion 51.

(9) According to the first embodiment, the first connection port P1, the second connection port P2, and the third connection port P3 are arranged in the order thereof along the circumference of the cross section, and the ball portion 50 rotates the first recessed portion 51 in the certain rotation direction.

By rotating the ball portion 50 in the certain rotation direction, it is possible to simplify the operation of moving the first recessed portion 51.

(10) According to the first embodiment, the first recessed portion 51 or 54 is capable of containing N solid target substances 27a, where N is an integer equal to or greater than 1. The ball portion 50 or 50a supplies N solid target substances 27a to the third connection port P3 every time the first recessed portion 51 or 54 makes one rotation.

Accordingly, by controlling the rotation of the ball portion 50 or 50a, the supply amount of the solid target substances 27a per unit time can be controlled. By using the ball portion 50a having N as an integer equal to or greater than 2, it is possible to increase the supply amount of the solid target substances 27a per one rotation of the ball portion 50a. In other words, since the number of rotations of the ball portion 50a per supply amount of the solid target substances 27a is reduced, the life of the ball portion 50a can be improved.

(11) According to the first embodiment, the ball portion 50b further includes the second recessed portion 52 that contains the solid target substance 27a supplied from the reservoir tank C1 and rotates with the first recessed portion 51 about the rotation axis 55. Each of the first and second recessed portions 51 and 52 is capable of containing N solid target substances 27a, where N is an integer equal to or greater than 1. The ball portion 50b supplies N×2 solid target substances 27a to the third connection port P3 every time the first and second recessed portions 51 and 52 make one rotation.

By providing the first and second recessed portions 51 and 52, the supply amount of the solid target substances 27a per one rotation of the ball portion 50b is increased, and the life of the ball portion 50b can be improved.

(12) According to the first embodiment, the ball portion 50c further includes the second to M-th recessed portions 52 to 5M that contain the solid target substances 27a supplied from the reservoir tank C1 and rotate about the rotation axis 55 together with the first recessed portion 51, where M is an integer equal to or greater than 3. Each of the first to M-th recessed portions 51 to 5M is capable of containing N solid target substances 27a, where N is an integer equal to or greater than 1. The ball portion 50c supplies N×M solid target substances 27a to the third connection port P3 every time the first to M-th recessed portions 51 to 5M make one rotation.

By providing the first to M-th recessed portions 51 to 5M, the supply amount of the solid target substances 27a per one rotation of the ball portion 50c is increased and the life of the ball portion 50c can be improved.

4. Body Portion C4 with Fifth Connection Port P5 for Forcible Exhaust

4.1 Configuration

Figure 9:
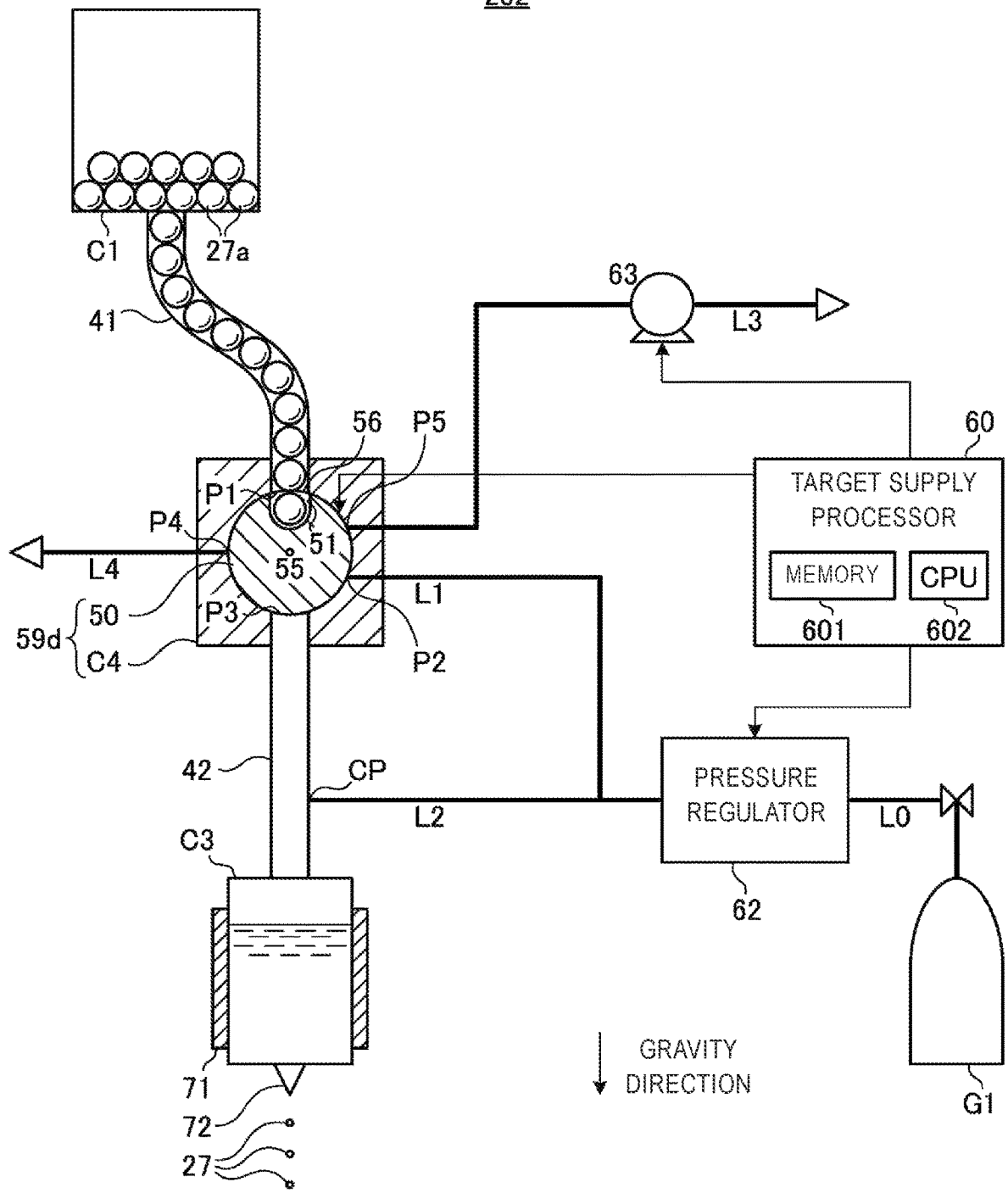
FIG. 9 schematically illustrates a configuration of a target supply device according to a second embodiment.

FIG. 9 schematically illustrates a configuration of a target supply device 262 according to the second embodiment. In the first embodiment, not only the gas supply line L1 but also the forcible exhaust line L3 are connected to the second connection port P2, whereas in the second embodiment, the forcible exhaust line L3 is connected to a fifth connection port P5.

A body portion C4 of the ball valve 59d illustrated in FIG. 9 includes the fifth connection port P5 in addition to the first to fourth connection ports P1 to P4 on the circumference about the rotation axis 55 of the ball portion 50. The fifth connection port P5 is located between the first connection port P1 and the second connection port P2. A seal portion (not illustrated) brought into contact with the surface of the ball portion 50 is formed on the inner wall surface of the body portion C4 and around the fifth connection port P5. The body portion C4 corresponds to the second container in the present disclosure.

Further, it is desirable that the width of the fifth connection port P5 is smaller than the diameter of the solid target substance 27a. The width of the fifth connection port P5 is, for example, 0.01 times or more and 0.9 times or less than the diameter of the solid target substance 27a. The fifth connection port P5 preferably has smaller area than any of the first connection port P1, the third connection port P3, and the opening 56.

The gas supply line L1 is connected to the second connection port P2. The forcible exhaust line L3 is connected to the fifth connection port P5 without being connected to the gas supply line L1.

The valve V1, the valve V2, and the valve V3 may not be provided in the gas supply line L1, the gas supply line L2, and the forcible exhaust line L3, respectively.

In other respects, the configuration of the second embodiment is similar to that of the first embodiment.

4.2 Operation

When the ball portion 50 rotates about the rotation axis 55, the opening 56 of the first recessed portion 51 is overlapped with the first connection port P1, the fifth connection port P5, the second connection port P2, the third connection port P3, and the fourth connection port P4 in this order.

After the solid target substance 27a moves into the first recessed portion 51 by the opening 56 being overlapped with the first connection port P1, the opening 56 is overlapped with the fifth connection port P5. The exhaust pump 63 may be activated before the opening 56 is overlapped on the fifth connection port P5. In this case, when the opening 56 is overlapped with the fifth connection port P5, the inside of the first recessed portion 51 is exhausted to a pressure less than the atmospheric pressure in a short time.

Next, the opening 56 is overlapped with the second connection port P2. The valve V1 (see FIG. 3) may not be provided in the gas supply line L1, or when the valve V1 is provided, the valve V1 may be opened before the opening 56 is overlapped with the second connection port P2. In such cases, when the opening 56 is overlapped with the second connection port P2, the pressurized gas is supplied from the gas supply line L1 to the first recessed portion 51 in a short time.

Thereafter, the operation when the opening 56 is overlapped sequentially with the third connection port P3 and the fourth connection port P4 is similar to that of the first embodiment.

4.3 Effect

(13) According to the second embodiment, the body portion C4 includes the fifth connection port P5 connected to the forcible exhaust line L3 in addition to the first connection port P1, the second connection port P2, and the third connection port P3. The ball portion 50 causes the opening 56 to be overlapped sequentially with the first connection port P1, the fifth connection port P5, the second connection port P2, and the third connection port P3.

Accordingly, since the fifth connection port P5 is used as a connection port dedicated to forcible exhaust and the second connection port P2 is used as a connection port dedicated to pressurization, forcible exhaust and pressurization can be sequentially performed even without switching between opening and closing of the valve V1 and the V3.

However, the valve V1 and the valve V2 (see FIG. 3) may be provided in the gas supply line L1 and the gas supply line L2, respectively. If the valve V1 is opened in a state in which the valve V2 is closed, when the pressurized gas is supplied to the first recessed portion 51, the gas inside the pressure tank C3 is suppressed from flowing into the first recessed portion 51, and the pressure fluctuation inside the pressure tank C3 can be suppressed.

Alternatively, instead of providing the valves V1 and V2, a choke unit (not illustrated) such as an orifice or a venturi may be provided in the gas supply line L1 or the gas supply line L2. If the choke unit is provided, when the pressurized gas is supplied to the first recessed portion 51, the gas inside the pressure tank C3 is restrained from rapidly flowing into the first recessed portion 51, and the pressure fluctuation inside the pressure tank C3 can be restrained.

Further, the valve V3 may be provided at a position between the body portion C4 and the exhaust pump 63 in the forcible exhaust line L3.

(14) According to the first embodiment, the fifth connection port P5 has smaller area than any of the first connection port P1, the third connection port P3, and the opening 56.

This prevents the solid target substance 27a that can pass through the first connection port P1, the third connection port P3, and the opening 56 from entering the fifth connection port P5.

In other respects, the second embodiment is similar to the first embodiment.

5. Target Supply Device 263 Replenishing Solid Target Substance 27a while Measuring Liquid Level in Pressure Tank C3

In the third embodiment described below, the solid target substance 27a is replenished when a certain time period elapses after the liquid level of the target substance in the pressure tank C3 becomes lower than a detection position.

5.1 Configuration

Figure 10:
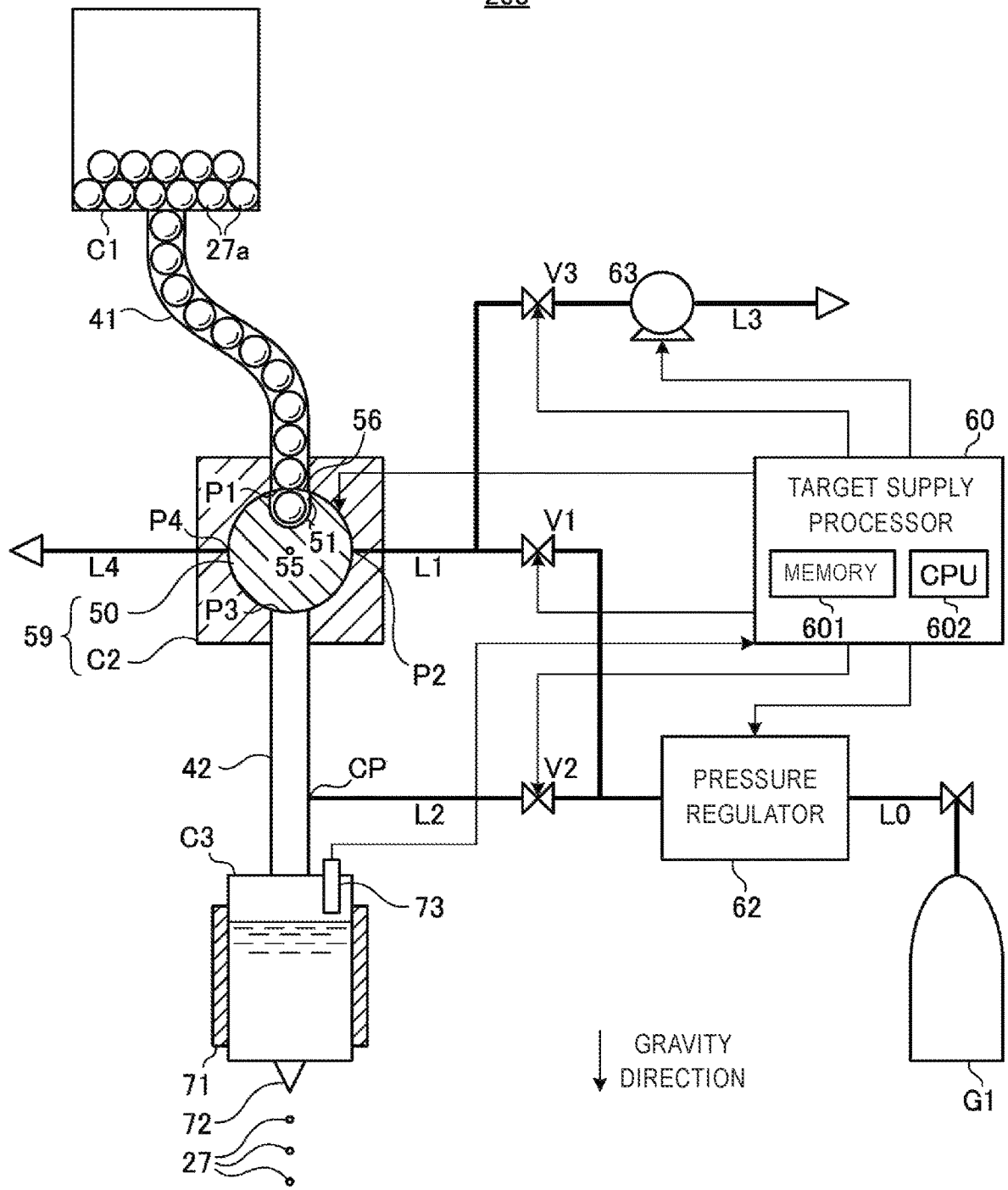
FIG. 10 schematically illustrates a configuration of a target supply device according to a third embodiment.

FIG. 10 schematically illustrates a configuration of a target supply device 263 according to the third embodiment.

The target supply device 263 includes a liquid level sensor 73 that detects the amount of the target substances in the pressure tank C3. The liquid level sensor 73 may be, for example, a sensor for detecting the presence or absence of contact with the target substance. The presence or absence of contact with the target substance is detected by, for example, whether or not the lower end of the liquid level sensor 73 is electrically connected to a conductive member that is in contact with the target substance inside the pressure tank C3. When the lower end of the liquid level sensor 73 is in contact with the target substance, it is possible to detect that the liquid level of the target substance is equal to or higher than the detection position, that is, the amount of the target substance is equal to or greater than a first value. If the lower end of the liquid level sensor 73 is not in contact with the target substance, it is possible to detect that the liquid level of the target substance is lower than the detection position, that is, the amount of the target substance is smaller than the first value. The liquid level sensor 73 is an example of the sensor in the present disclosure. The first value is a value close to the upper limit of the quantity of target substance contained in the pressure tank C3. However, even when the target substance slightly more than the first value is contained in the pressure tank C3, there is no problem in the operation of the target supply device 263.

In other respects, the configuration of the third embodiment is similar to that of the first embodiment. Alternatively, in the third embodiment, similarly to the second embodiment, the configuration of the body portion C4 including the fifth connection port P5 for forcible exhaust may be adopted.

5.2 Operation

FIG. 11 illustrates operation procedure of the target supply device 263 according to the third embodiment. The processes from S11 to S13 and from S21 to S42 are similar to the corresponding processes in the first embodiment. In the third embodiment, the process of S15a is performed instead of S15, and the processes of S43a and S44a are performed instead of S43.

In S15a, first, the target supply processor 60 monitors whether or not the liquid level in the pressure tank C3 is lower than the detection position of the liquid level sensor 73. Further, the target supply processor 60 waits until the target substance is consumed after a certain time period elapses after the liquid level becomes lower than the detection position of the liquid level sensor 73. In S15a, the movement of the first recessed portion 51 is suppressed, and the replenishment of the solid target substance 27a is suppressed. When the certain time period elapses after the liquid level has become lower than the detection position, processing proceeds to the next step.

With the processes from S21 to S42, the pressure tank C3 is replenished with the solid target substance 27a in the reservoir tank C1 via the ball valve 59.

In S43a, it is determined whether or not the solid target substance 27a is replenished until the liquid level in the pressure tank C3 becomes equal to or higher than the detection position. If the liquid level is not equal to or higher than the detection position, processing returns to S21 to further replenish the solid target substance 27a.

In S44a, when the liquid level becomes equal to or higher than the detection position, processing returns to S15a, and the movement of the first recessed portion 51 is suppressed until the target substance is consumed, thereby suppressing the replenishment of the solid target substance 27a.

5.3 Effect

(15) According to the third embodiment, the target supply device 263 includes the target supply processor 60 and further includes the liquid level sensor 73 that detects the amount of the target substance in the pressure tank C3. When the output of the liquid level sensor 73 indicates that the amount of the target substance inside the pressure tank C3 is equal to or greater than the first value, the target supply processor 60 suppresses the movement of the first recessed portion 51.

Accordingly, when the amount of the target substance in the pressure tank C3 is equal to or greater than a first value, replenishment of the solid target substance 27a is suppressed, thereby preventing the target substance from overflowing from the pressure tank C3.

(16) According to the third embodiment, the target supply processor 60 starts moving the first recessed portion 51 when after the amount of the target substance in the pressure tank C3 becomes smaller than the first value.

In the case where the liquid level sensor (not illustrated) directly measures that the amount of the target substance has decreased to the second value smaller than the first value to determine the timing to start the replenishment of the solid target substance 27a, the following problem arises. Although the solid target substance 27a is composed of highly pure tin, tin oxide may be generated on the surfaces thereof. When the solid target substance 27a is melted inside the pressure tank C3, a conductive film containing tin oxide may be formed on the liquid surface of the melted tin. Such a film may stick to the lower end of the liquid level sensor, and may grow like icicles to reach the bottom of the pressure tank C3. In this case, the liquid level sensor is electrically connected to the bottom of the pressure tank C3, and the function of the liquid level sensor becomes unstable. If the distance from the lower end of the liquid level sensor (not illustrated) to the bottom of the pressure tank C3 is short, it may be difficult for the liquid level sensor to stably function for a long period of time.

In contrast, the liquid level sensor 73 that detects whether or not the amount of the target substance is equal to or greater than the first value is located at a long distance from the bottom of the pressure tank C3. Even if a conductive film containing tin oxide adheres to the lower end of the liquid level sensor 73, the liquid level sensor 73 can stably function for a long period of time. Therefore, the liquid level sensor 73 is used in the third embodiment. That is, when a certain time period elapses after the amount of the target substance in the pressure tank C3 becomes smaller than the first value, it can be estimated that the target substance is consumed according to the length of the certain time period. If the timing of starting the replenishment of the solid target substance 27a is determined based on the above, it is possible to reduce the necessity of directly measuring the decrease in the amount of the target substance by a liquid level sensor (not illustrated).

In other respects, the operation and effect of the third embodiment are similar to those of the first embodiment. Alternatively, in the third embodiment, when the configuration of the body portion C4 having the fifth connection port P5 for forcible exhaust is adopted, the third embodiment may have the similar operation and effect to the second embodiment.

6. Target Supply Device 264 Measuring Amount of Output Target Substance and Replenishing Solid Target Substance 27a The fourth embodiment described below is configured to replenish the solid target substance 27a in the same amount as the target substance output from the nozzle 72.

6.1 Configuration

Figure 12:
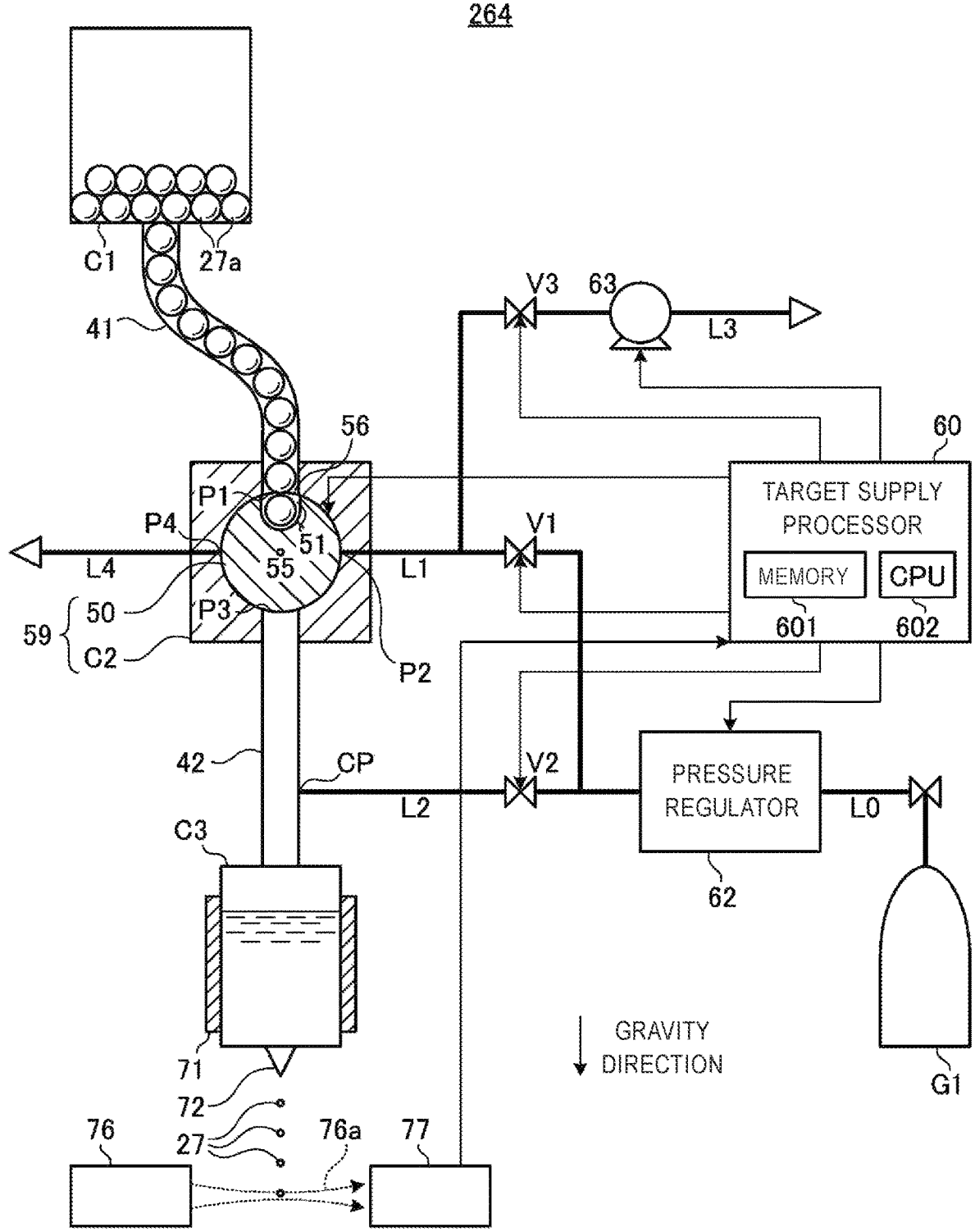
FIG. 12 schematically illustrates a configuration of a target supply device according to a fourth embodiment.

FIG. 12 schematically illustrates a configuration of a target supply device 264 according to the fourth embodiment.

The target supply device 264 includes a target sensor 77 for counting the number of targets 27 output from the nozzle 72. The target sensor 77 is used with a light source 76.

The light source 76 outputs illumination light 76a toward the trajectory of the target 27. When passing through the optical path of the illumination light 76a, the target 27 blocks a portion of the illumination light 76a or reflects a portion of the illumination light 76a.

The target sensor 77 includes, for example, an image sensor (not illustrated) and an optical system (not illustrated)

that forms an image of an object located on the trajectory of the target 27 on a light receiving surface of the image sensor. The target sensor 77 receives light other than light 76a blocked by the target 27 or a portion of the light reflected by the target 27, and detects the target 27 by detecting a change of the intensity distribution of the light.

The target supply processor 60 counts the number of targets 27 that have passed through the optical path of the illumination light 76a based on the signal output from the target sensor 77. The amount of the target substance output from the nozzle 72 may be obtained by multiplying the number of targets 27 by the mass of one target 27. Thus, the target supply processor 60 can measure the amount of the target substance output from the nozzle 72.

In other respects, the configuration of the fourth embodiment is similar to that of the first embodiment.

Alternatively, in the fourth embodiment, similarly to the second embodiment, the configuration of the body portion C4 including the fifth connection port P5 for forcible exhaust may be adopted.

6.2 Operation

FIG. 13 illustrates operation procedure of the target supply device 264 according to the fourth embodiment. The processes from S11 to S13 and from S15 to S42 are similar to the corresponding processes in the first embodiment. In the fourth embodiment, the process of S14b is performed between S13 and S15, and the processes of S43b and S44b are performed instead of S43.

In S14b, the target supply processor 60 starts measuring the amount of target substance output from the nozzle 72.

Thereafter, in S15, the target supply processor 60 continues to measure the quantity of target substance output from the nozzle 72 until a certain time period elapses. In other words, the movement of the first recessed portion 51 is suppressed, and the replenishment of the solid target substance 27a is suppressed. After a certain time period elapses, processing proceeds to the next step.

With the processes from S21 to S42, the pressure tank C3 is replenished with the solid target substance 27a in the reservoir tank C1 via the ball valve 59.

In S43b, it is determined whether or not the amount of the solid target substances 27a replenished into the pressure tank C3 is equal to or greater than the amount of the target substance output from the nozzle 72. The amount of the solid target substances 27a replenished into the pressure tank C3 may be obtained by multiplying the number of solid target substances 27a by the mass of one solid target substance 27a. If the amount of the replenished solid target substances 27a is less than the amount of the output target substance, processing returns to S21 to further replenish the solid target substance 27a.

In S44b, when the amount of the replenished solid target substances 27a becomes equal to or greater than the amount of the output target substance, processing returns to S14b and the measurement of the amount of the target substance output from the nozzle 72 is started again.

6.3 Effect

(17) According to the fourth embodiment, the target supply device 264 includes the target supply processor 60 and further includes the target sensor 77 for measuring the quantity of target substance output from the nozzle 72. The target supply processor 60 suppresses the movement of the first recessed portion 51 when the amount of the solid target substances 27a supplied from the third connection port P3 becomes equal to or greater than the amount of the target substance output from the nozzle 72.

Accordingly, since the pressure tank C3 is replenished with the solid target substance 27a until the replenished amount becomes equal to or greater than the amount of the target substance output from the nozzle 72, the target substance is prevented from overflowing from the pressure tank C3 even if the liquid level sensor 73 (see FIG. 10) is not provided.

(18) According to the fourth embodiment, the target supply processor 60 starts the movement of the first recessed portion 51 when a certain time period elapses after the amount of the solid target substances 27a supplied from the third connection port P3 becomes equal to or greater than the amount of the target substance output from the nozzle 72.

Accordingly, the solid target substance 27a can be replenished before the target substance in the pressure tank C3 is exhausted, even if a liquid level sensor (not illustrated) for detecting the lower limit of the amount of the target substance is not provided.

In other respects, the operation and effect of the fourth embodiment are similar to those of the first embodiment. Alternatively, in the fourth embodiment, when the configuration of the body portion C4 having the fifth connection port P5 for forcible exhaust is adopted, the fourth embodiment may have the similar operation and effect to the second embodiment.

7. Others

Figure 14:
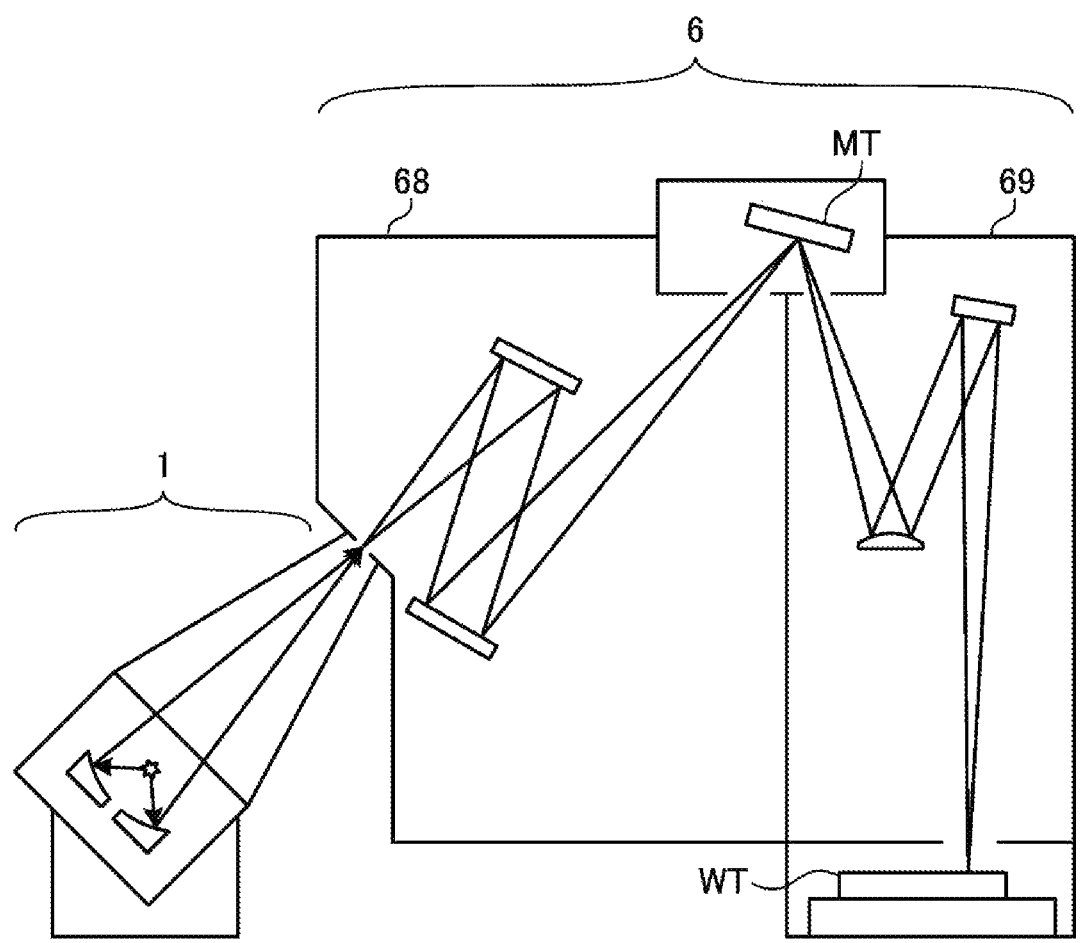
FIG. 14 schematically illustrates a configuration of an exposure apparatus connected to an EUV light generation apparatus.

FIG. 14 schematically illustrates a configuration of the exposure apparatus 6 connected to the EUV light generation apparatus 1.

In FIG. 14, the exposure apparatus 6 includes a mask irradiation unit 68 and a workpiece irradiation unit 69. The mask irradiation unit 68 illuminates, via the reflection optical system, the mask pattern of the mask table MT with the EUV light incident from the EUV light generation apparatus 1. The workpiece irradiation unit 69 images the EUV light reflected by the mask table MT onto a workpiece (not illustrated) disposed on the workpiece table WT via the reflection optical system. The workpiece is a photosensitive substrate such as a semiconductor wafer on which photoresist is applied. The exposure apparatus 6 synchronously translates the mask table MT and the workpiece table WT to expose the workpiece to the EUV light reflecting the mask pattern. Through the exposure process as described above, a device pattern is transferred onto the semiconductor wafer, thereby an electronic device can be manufactured.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A target supply device, comprising:
   a first container configured to contain a solid target substance;
   a second container including a first connection port connected to the first container, a second connection port connected to a first pressurized gas supply line, and a third connection port connected to a target substance lead-out path;
   a moving body including a first recessed portion configured to contain the solid target substance supplied from the first container and move the first recessed portion inside the second container to cause an opening of the first recessed portion to be overlapped sequentially with the first connection port, the second connection port, and the third connection port;
   a third container connected to both a second pressurized gas supply line and the target substance lead-out path and configured to melt the solid target substance supplied from the third connection port; and
   a nozzle configured to output the melted target substance supplied from the third container.

2. The target supply device according to claim 1,
   wherein the second connection port is connected to both a forcible exhaust line and the first pressurized gas supply line.

3. The target supply device according to claim 1,
   wherein a width of the second connection port is smaller than a diameter of the solid target substance supplied from the first container.

4. The target supply device according to claim 1,
   wherein the second connection port has smaller area than any of the first connection port, the third connection port, and the opening.

5. The target supply device according to claim 1,
   wherein the second pressurized gas supply line is connected to the third container by being connected to the target substance lead-out path.

6. The target supply device according to claim 1, further comprising:
   a common pressurized gas supply line configured to supply pressurized gas to the first pressurized gas supply line and the second pressurized gas supply line,
   a first valve disposed in the first pressurized gas supply line,
   a second valve disposed in the second pressurized gas supply line, and
   a processor,
   wherein the processor controls the first valve, the second valve, and the moving body such that, with the opening of the first recessed portion overlapped with the second connection port and the second valve closed, the first valve is opened to supply pressurized gas to the first recessed portion, and then, the opening of the first recessed portion is overlapped with the third connection port to supply the solid target substance from the first recessed portion to the third container.

7. The target supply device according to claim 1,
   wherein the second container further includes a fourth connection port connected to an exhaust line, and
   the moving member causes the opening to be overlapped sequentially with the first connection port, the second connection port, the third connection port, and the fourth connection port.

8. The target supply device according to claim 1,
   wherein an inner wall of the second container has a circular cross section, and
   the moving body rotates the first recessed portion about a rotation axis perpendicular to the cross section.

9. The target supply device according to claim 8,
   wherein the first connection port, the second connection port, and the third connection port are arranged in the order thereof along a circumference of the cross section, and
   the moving body rotates the first recessed portion in a certain rotational direction.

10. The target supply device according to claim 8,
    wherein the first recessed portion is capable of containing N solid target substances, N being an integer equal to or greater than 1, and
    the moving body supplies the N solid target substances to the third connection port every time the first recessed portion makes one rotation.

11. The target supply device according to claim 8,
    wherein the moving body further includes a second recessed portion configured to contain the solid target substance supplied from the first container and rotate along with the first recessed portion about the rotation axis,
    each of the first and second recessed portions is capable of containing N solid target substances, N being an integer equal to or greater than 1, and
    the moving body supplies N×2 solid target substances to the third connection port every time the first and second recessed portions make one rotation.

12. The target supply device according to claim 8,
    wherein the moving body further includes second to M-th recessed portions each configured to contain the solid target substance supplied from the first container and rotate along with the first recessed portion about the rotation axis, M being an integer equal to or greater than 3,
    each of the first to M-th recessed portions is capable of containing N solid target substances, N is an integer equal to or greater than 1, and
    the moving body supplies N×M solid target substances to the third connection port every time the first to M-th recessed portions make one rotation.

13. The target supply device according to claim 1,
    wherein the second container further includes a fifth connection port connected to a forcible exhaust line, and
    the moving body causes the opening to be overlapped sequentially with the first connection port, the fifth connection port, the second connection port, and the third connection port.

14. The target supply device according to claim 13,
    wherein the fifth connection port has smaller area than any of the first connection port, the third connection port, and the opening.

15. The target supply device according to claim 1, further comprising:
    a sensor configured to detect an amount of the target substance in the third container, and
    a processor,
    wherein the processor suppresses moving the first recessed portion when an output of the sensor indicates that an amount of the target substance in the third container is equal to or greater than a first value.

16. The target supply device according to claim 15,
wherein the processor starts moving the first recessed portion when a certain time period elapses after the amount of the target substance in the third container becomes smaller than the first value.

17. The target supply device according to claim 1, further comprising:
a target sensor configured to measure an amount of the target substance output from the nozzle,
and a processor,
wherein the processor suppresses moving the first recessed portion when an amount of the solid target substances supplied from the third connection port is equal to or greater than the amount of the target substance output from the nozzle.

18. The target supply device according to claim 17,
wherein the processor starts moving the first recessed portion when a certain time period elapses after the amount of the solid target substances supplied from the third connection port becomes equal to or greater than the amount of the target substance output from the nozzle.

19. A target supply method with an extreme ultraviolet light generation apparatus using a target supply device, the method comprising causing, by a moving body, an opening of a first recessed portion to be overlapped with a first connection port, then to be overlapped with a second connection port, and then to be overlapped with a third connection port,
the target supply device including:
a first container configured to contain a solid target substance;
a second container including the first connection port connected to the first container, the second connection port connected to a first pressurized gas supply line, and the third connection port connected to a target substance lead-out path;
the moving body including the first recessed portion configured to contain the solid target substance supplied from the first container and move the first recessed portion inside the second container;
a third container connected to both a second pressurized gas supply line and the target substance lead-out path and configured to melt the solid target substance supplied from the third connection port; and
a nozzle configured to output the melted target substance supplied from the third container.

20. An electronic device manufacturing method, comprising:
generating extreme ultraviolet light by irradiating a target substance with pulsed laser light in an extreme ultraviolet light generation apparatus;
emitting the extreme ultraviolet light to an exposure apparatus; and
exposing a photosensitive substrate to the extreme ultraviolet light in the exposure apparatus to manufacture an electronic device,
the extreme ultraviolet light generation apparatus including:
a target supply device; and
a laser light concentrating mirror configured to concentrate pulsed laser light on the target substance output to a predetermined region from the target supply device,
the target supply device including:
a first container configured to contain a solid target substance;
a second container including a first connection port connected to the first container, a second connection port connected to a first pressurized gas supply line, and a third connection port connected to a target substance lead-out path;
a moving body including a first recessed portion configured to contain the solid target substance supplied from the first container and move the first recessed portion inside the second container;
a third container connected to both a second pressurized gas supply line and the target substance lead-out path and configured to melt the solid target substance supplied from the third connection port; and
a nozzle configured to output the melted target substance supplied from the third container.

* * * * *